(12) United States Patent
Asayama et al.

(10) Patent No.: US 7,239,538 B2
(45) Date of Patent: Jul. 3, 2007

(54) SEMICONDUCTOR STORAGE DEVICE

(75) Inventors: Shinobu Asayama, Kawasaki (JP);
Toshio Komuro, Kawasaki (JP)

(73) Assignee: NEC Electronics Corporation,
Kanagawa (JP)

( * ) Notice: Subject to any disclaimer, the term of this patent is extended or adjusted under 35 U.S.C. 154(b) by 0 days.

(21) Appl. No.: 11/318,776

(22) Filed: Dec. 28, 2005

(65) Prior Publication Data

US 2006/0171192 A1    Aug. 3, 2006

(30) Foreign Application Priority Data

Jan. 28, 2005    (JP)    ............................ 2005-022238

(51) Int. Cl.
*G11C 11/40*    (2006.01)
(52) U.S. Cl. ..................................... 365/154
(58) Field of Classification Search ................ 365/155, 365/156
See application file for complete search history.

(56) References Cited

U.S. PATENT DOCUMENTS 6,091,626 A *    7/2000   Madan ....................... 365/154
7,164,596 B1*    1/2007   Deng et al. ................. 365/154

FOREIGN PATENT DOCUMENTS

JP    08-0007574    1/1996
JP    11-007776    1/1996

* cited by examiner

*Primary Examiner*—Tan T. Nguyen
(74) *Attorney, Agent, or Firm*—Young & Thompson

(57) ABSTRACT

The SRAM cell 1 includes inverters 10, 20, N-type FETs (Field Effect Transistors) 32, 34, 36, 38, word lines 42, 44, and bit lines 46, 48. A gate width W2 and gate length L2 of the FETs 32, 34, 36, 38 are equal to a gate width W3 and gate length L3 of the FETs 12, 22, respectively. In particular, in this embodiment, a gate width W4 and gate length L4 of the FETs 14, 24 are also equal to W2 (=W3) and L2 (=L3), respectively. Namely, the SRAM cell 1 is designed in such a manner that W2=W3=W4, and L2=L3=L4.

6 Claims, 6 Drawing Sheets

SEMICONDUCTOR STORAGE DEVICE

This application is based on Japanese patent application No. 2005-022238, the content of which is incorporated hereinto by reference.

BACKGROUND

1. Technical Field

The present invention relates to a semiconductor storage device.

2. Related Art

Semiconductor storage devices of the related art are disclosed, for example, in Japanese Laid-open Patent Publication No. H11-7776. As shown in FIG. 5, the semiconductor storage device disclosed in the same document is equipped with an SRAM cell constructed from six transistors 101 to 106. Namely, in addition to four transistors 101 to 104 constituting a latch circuit, the SRAM cell also has two pass transistors 105, 106 provided between the latch circuit and bit lines on either side. Further, a semiconductor storage device with pass transistors provided doubly is disclosed in Japanese Laid-open Patent Publication No. H8-7574.

Typically, in a SRAM cell, in order to obtain the necessary cell ratio, it has been necessary to carry out design in such a manner that the power (current-drive power) of pass transistors is lower than that of drive transistors, namely, N-type FETs (Field Effect Transistors) constituting a latch circuit. Here, "cell ratio" is the power ratio of a drive transistor and a pass transistor. Adjustment of the cell ratio can be carried out, for example, by adjusting the threshold voltages of these transistors. However, in this case it is necessary to introduce impurities under different conditions for a pass transistor and a drive transistor and manufacture of a semiconductor storage device therefore becomes complex.

Further, as shown in FIG. 6, adjustment of the cell ratio can be carried out by adjusting the gate length and the gate width of these transistors. The same drawing is a plan view of the SRAM cell corresponding to the circuit of FIG. 5. In the same drawing, a gate length L2 of the pass transistors 105, 106 is designed to be larger than a gate length L3 of the drive transistors 102, 104. Further, a gate width W2 of the pass transistors 105, 106 is designed to be smaller than a gate width W3 of the drive transistors 102, 104.

SUMMARY OF THE INVENTION

However, when gate length and gate width are different between a pass transistor and a drive transistor, the number of parameters it is intended to manage at the time of manufacture becomes large, and manufacture of a semiconductor storage device therefore becomes complex.

According to the present invention, there is provided a semiconductor storage device comprising an SRAM cell, said SRAM cell comprising: an N-type conduction type first drive transistor constituting a first inverter; an N-type conduction type second drive transistor constituting a second inverter with an input terminal and an output terminal connected to an output terminal and an input terminal of said first inverter, respectively; a first pass transistor provided in a path between said output terminal of said first inverter and a first bit line; a second pass transistor provided in a path between said output terminal of said second inverter and a second bit line; a third pass transistor provided in a path between said first pass transistor and said first bit line; and a fourth pass transistor provided in a path between said second pass transistor and said second bit line, wherein said each drive transistor and said each pass transistor have mutually equal gate widths or gate lengths.

With this semiconductor storage device, the number of parameters to be managed at the time of manufacture can be kept small because design takes place in such a manner that at least one of the gate width or the gate length are the same between each pass transistor and each drive transistor. As a result, a semiconductor storage device that is easy to manufacture can be realized. Further, the third pass transistor is provided between the first pass transistor and the first bit line, and the fourth pass transistor is provided between the second pass transistor and the second bit line. As a result, the overall power of the first and third pass transistors is lower than the individual power of the first or third pass transistor. The same can also be said for the second and fourth pass transistors. It is therefore possible to ensure the necessary cell ratio even in the case where the power of each pass transistor and each drive transistor are equal.

According to the present invention, it is possible to ensure the necessary cell ratio and realize a semiconductor storage device that is easy to manufacture.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

The following is a detailed description with reference to the drawings of a preferred embodiment of a semiconductor storage device of the present invention. In the description of the drawings, the same elements are given the same numerals and duplicated descriptions will not be given.

(First Embodiment)

Figure 1:
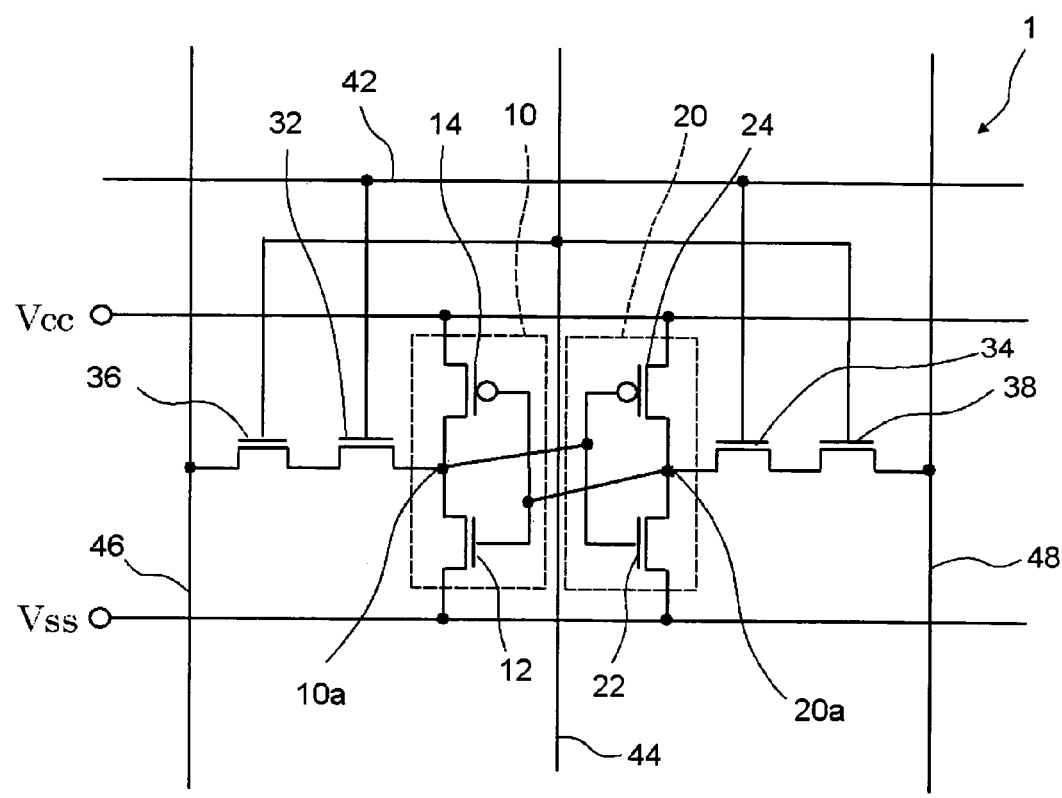
FIG. 1 is a circuit structure view illustrating an SRAM cell provided in a semiconductor storage device of the first embodiment of the present invention.
Figure 2:
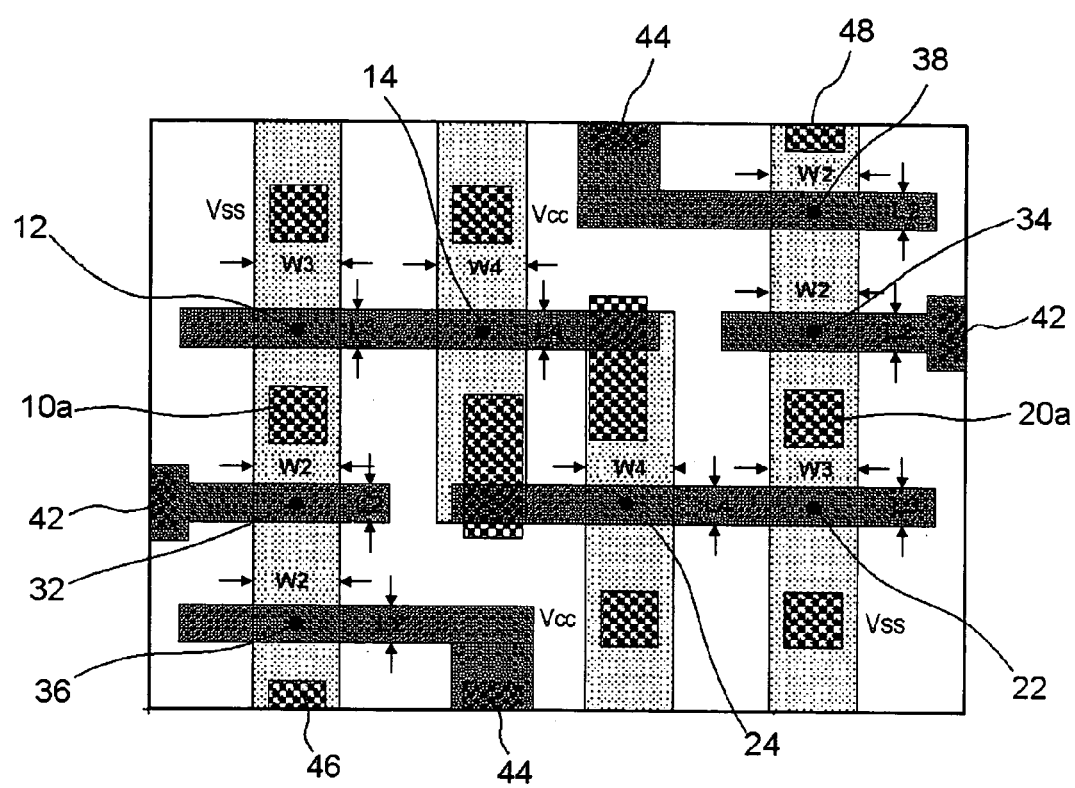
FIG. 2 is a plan view illustrating the SRAM cell of FIG. 1.

FIG. 1 is a circuit structure view illustrating an SRAM cell provided in a semiconductor storage device of the first embodiment of the present invention. Further, FIG. 2 is a plan view illustrating the same SRAM cell. The semiconductor storage device of this embodiment is an SRAM (Static Random Access Memory) and includes a plurality of SRAM cells 1 shown in the drawing.

The SRAM cell 1 includes inverters 10, 20, N-type FETs (Field Effect Transistors) 32, 34, 36, 38, word lines 42, 44, and bit lines 46, 48. The inverters 10, 20 mutually intersect and are coupled, and constitute a latch circuit. Namely, the output terminal 10*a* of the inverter 10 (first inverter) and the input terminal of the inverter 20 (second inverter) are connected, and the input terminal of the inverter 10 and the output terminal 20*a* of the inverter 20 are connected.

The inverter 10 is composed of an N-type FET 12 (first drive transistor) and a P-type FET 14 (first load transistor). Similarly, the inverter 20 is composed of an N-type FET 22 (second drive transistor) and a P-type FET 24 (second load transistor). The FETs 12, 22 function as drive transistors and the FETs 14, 24 function as load transistors. Further, power supply voltage $V_{ss}$ is applied to the sources of the FETs 12, 22. On the other hand, power supply voltage $V_{cc}$ is applied to the sources of the FETs 14, 24, where $V_{ss}<V_{cc}$. Here, the value of $V_{ss}$ can be set, for example, to 0V (earth potential) and the value of $V_{cc}$ can be set, for example, to 1.0V.

The FET 32 (first pass transistor) is then provided in a path between the output terminal 10*a* of the inverter 10 and the bit line 46 (first bit line). Further, the FET 36 (third pass transistor) is provided in a path between the FET 32 and the bit line 46. Specifically, the drains of FETs 12, 14 and the drain of the FET 32 are connected, and the source of the FET 32 and the drain of the FET 36 are connected. Further, the source of the FET 36 is connected to the bit line 46. These FETs 32, 36 function as pass transistors.

Similarly, the FET 34 (second pass transistor) is provided in a path between the output terminal 20*a* of the inverter 20 and the bit line 48 (second bit line). Moreover, the FET 38 (fourth pass transistor) is provided in a path between the FET 34 and the bit line 48. Specifically, the drains of the FETs 22, 24 and the drain of the FET 34 are connected, and the source of the FET 34 and the drain of the FET 38 are connected. Further, the source of the FET 38 is connected to the bit line 48. These FETs 34, 38 also function as pass transistors.

The gates of the FETs 32, 34 are connected to the word line 42 (first word line). On the other hand, the gates of the FET 36, 38 are connected to the word line 44 (second word line).

As shown in FIG. 2, a gate width W2 and gate length L2 of the FETs 32, 34, 36, 38 are equal to a gate width W3 and gate length L3 of the FETs 12, 22, respectively. In particular, in this embodiment, a gate width W4 and gate length L4 of the FETs 14, 24 are also equal to W2 (=W3) and L2 (=L3), respectively. Namely, the SRAM cell 1 is designed in such a manner that W2=W3=W4, and L2=L3=L4.

As can be understood from the same drawing, in the SRAM cell 1, diffusion layers provided with source-drain regions of the FETs 12, 14, 22, 24, 32, 34, 36, 38 are laid out along a straight line. Further, polysilicon layers constituting gate electrodes of the FETs 12, 14, 22, 24, 32, 34, 36, 38 are laid out in a straight line. In other words, these diffusion layers and polysilicon layers respectively extend along straight lines.

A description is now given of the operation of the SRAM cell 1. First, a description is given of the read operation. In this example, the potential of the output terminal 10*a* is taken to be low ($V_{ss}$), and the potential of the output terminal 20*a* is taken to be high ($V_{cc}$). Further, the bit lines 46, 48 are taken to be in a pre-charged high state. In this state, the FETs 32, 34, 36, 38 are put on by putting the potential of the word lines 42, 44 high. In doing so, the bit line 46 is discharged. As a result, it is possible to read out data stored in the latch circuit.

Next, a description is given of the write operation. In this example, it is taken that data is written in such a manner that the potential of the output terminal 10*a* becomes high and the potential of the output terminal 20*a* becomes low. First, one (bit line 46) of the pre-charged bit lines 46, 48 is held high, and the other (bit line 48) is put low. In this state, the potential of the word lines 42, 44 are put high. As a result, the FETs 32, 34, 36, 38 are put on, and the output terminal 10*a* and the output terminal 20*a* are put to high and low, respectively. Data can therefore be written to the latch circuit.

Continuing on, a description is now given of the effects of this embodiment. With this semiconductor storage device, it is possible to keep the number of parameters to be managed at the time of manufacture small because design is such that gate widths are equal between the FETs 32, 34, 36, 38 and the FETs 12, 22. As a result, a semiconductor storage device that is easy to manufacture can be realized. Further, the FET 36 is provided between the FET 32 and the bit line 46, and the FET 38 is provided between the FET 34 and the bit line 48. The overall power of the FETs 32, 36 is therefore lower than the individual power of the FET 32 or the FET 36. The same is true for the FETs 34, 38. Because of this, even in the case where the power of each of FET 32, 34, 36, 38 and each of FET 12, 22 is equal, the overall power of the FETs 32, 36 is lower than the power of the FET 12, and the overall power of the FETs 34, 38 is lower than the power of the FET 22. It is therefore possible to ensure the necessary cell ratio. In this way, it is possible to ensure the necessary cell ratio and realize a semiconductor storage device that is easy to manufacture.

Figure 5:
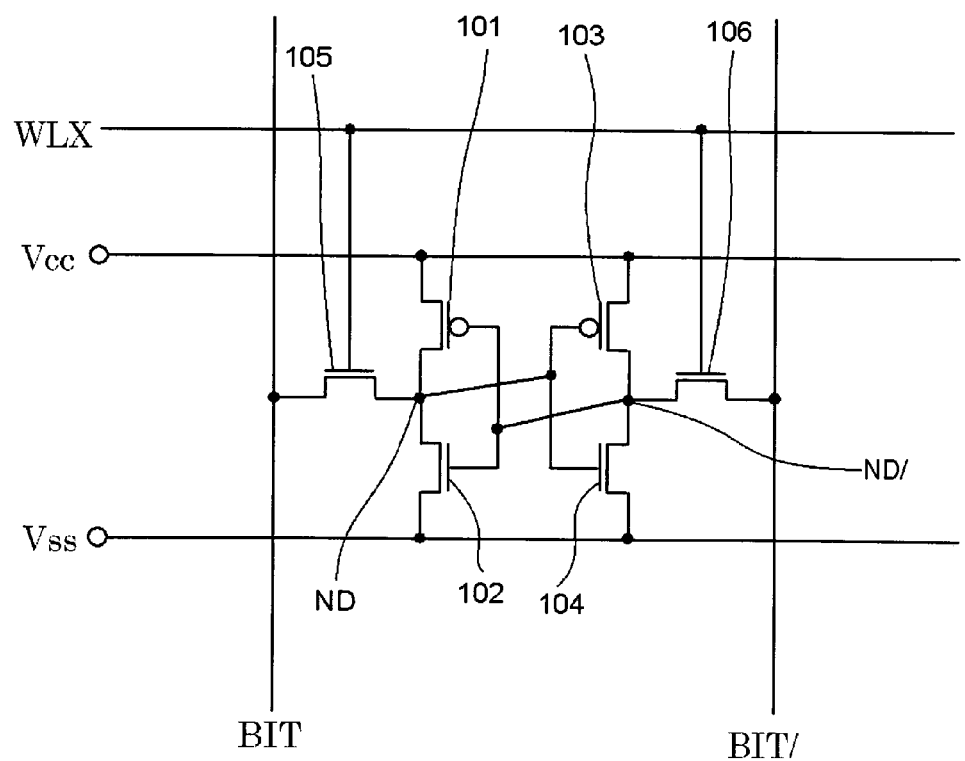
FIG. 5 is a circuit structure view illustrating an SRAM cell provided in a semiconductor storage device of the related art.
Figure 6:
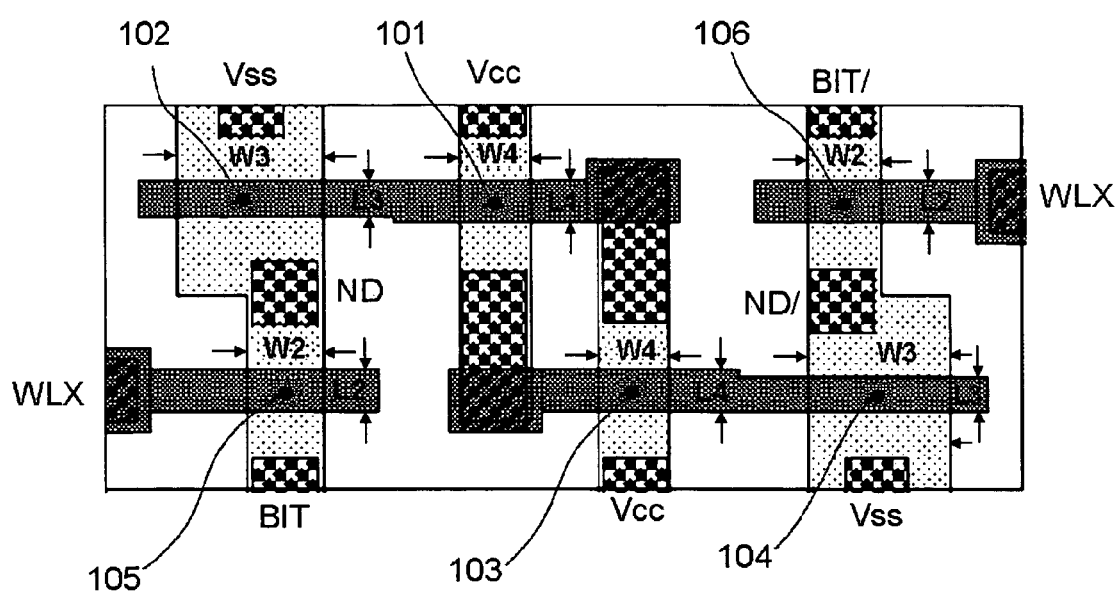
FIG. 6 is a plan view illustrating the SRAM cell of FIG. 5.

On the other hand, in the case of design where gate width and gate length of the pass transistors 105, 106 are different from the gate width and gate length of the drive transistors 102, 104, respectively, as in the SRAM cell of the related art (refer to FIG. 5), manufacture becomes complex because of an increase in the parameters to be managed at the time of manufacture. Further, variations in gate width and gate length become substantial and reduction in the yield rate occurs. In the SRAM cell of FIG. 5, setting of the gate width and gate length to different values between the pass transistors 105, 106 and the drive transistors 102, 104 is to ensure the necessary cell ratio for preventing read failure. In the same drawing, in the event that the gate width and gate length of the pass transistors 105, 106 are equal to the gate width and gate length of the drive transistors 102, 104, respectively, it is not possible to obtain the required cell ratio and there is the fear that this may cause read failure.

In this embodiment, gate lengths of the FETs 32, 34, 36, 38 and the FETs 12, 22 are designed to be mutually equal. It is therefore possible to bring about a semiconductor storage device that is substantially easier to manufacture because the number of parameters to be managed at the time of manufacture can be further reduced. Further, the gate widths and gate lengths of the FETs 14, 24 are designed to be equal to the gate widths and gate lengths of the FETs 12, 22, 32, 34, 36, 38, respectively. Manufacture of the semiconductor storage device is therefore substantially easier as a result.

The FETs 32, 34 and the FETs 36, 38 are controlled by the separate word lines 42, 44. Precharging or discharging of the word lines 42, 44 is therefore carried out only when both of the word lines 42, 44 are selected. It is therefore possible to achieve low power consumption with the semiconductor storage device of this embodiment because unnecessary pre-charging and discharging can be prevented.

Further, as described above, by controlling the FETs 32, 34 and the FETs 36, 38 using the separate word lines 42, 44, it is possible to select just the cell that is the target of reading or writing. As a result, with the semiconductor storage device of this embodiment, it is possible for the current flowing due to discharge to be kept small. As a result, the influence of IR drop when active becomes small, therefore reinforcement of the power supply and ground is no longer necessary and the degree of design freedom for upper layers increases. For example, it is possible for the layout for an SRAM cell to be concluded with just three metal layers. In this case, there is freedom in designing the fourth layer onwards and manufacturing costs can be reduced.

At the SRAM 1, the diffusion layers are laid out in a straight line. This makes manufacture of the semiconductor storage device of this embodiment straightforward. Manufacture of the semiconductor storage device is also made substantially more straightforward because the polysilicon layers are also laid out in a straight line.

(Second Embodiment)

Figure 3:
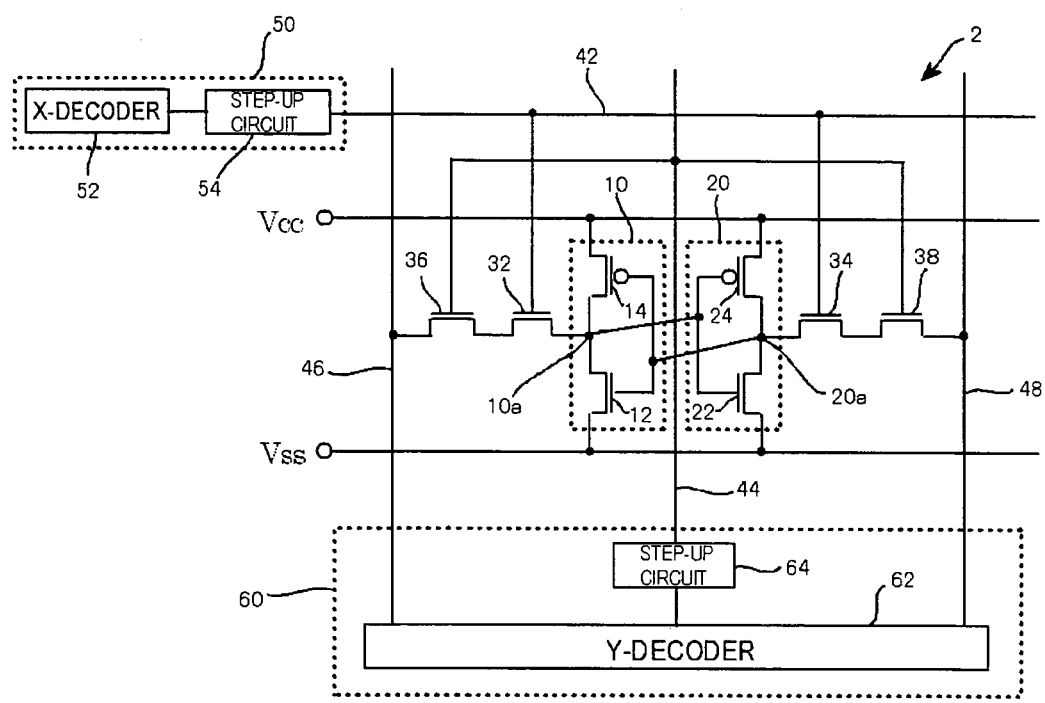
FIG. 3 is a circuit structure view illustrating an SRAM cell provided in a semiconductor storage device of the second embodiment of the present invention.

FIG. 3 is a circuit structure view illustrating an SRAM cell provided in a semiconductor storage device of the second embodiment of the present invention. The semiconductor storage device of this embodiment is also an SRAM and includes a plurality of SRAM cells 2 shown in the drawing. The SRAM cell 2 includes the inverters 10, 20, the N-type FETs 32, 34, 36, 38, the word lines 42, 44, and the bit lines 46, 48. The configuration of each of these elements is the same as for that for the SRAM cell 1 of FIG. 1.

Further, the SRAM cell 2 includes voltage applying circuits 50, 60. The voltage applying circuits 50, 60 are connected to the word lines 42, 44, respectively. The voltage applying circuit 50 (first voltage applying unit) includes a decoder 52 and a step-up circuit 54 and is a voltage applying unit applying a predetermined voltage to the word line 42. Similarly, the voltage applying circuit 60 (second voltage applying unit) includes a decoder 62 and a step-up circuit 64 and is a voltage applying unit applying a predetermined voltage to the word line 44.

The voltage applying circuits 50, 60 apply a voltage $V_{dd}$ (first voltage) to the word lines 42, 44 at the time of a read operation of the SRAM cell 2. The voltage applying circuits 50, 60 apply a voltage ($V_{dd}+\alpha$) (second voltage) to the word lines 42, 44 at a time of a write operation of the SRAM cell 2, where $\alpha>0$. Namely, the SRAM cell 2 is configured in such a manner that a voltage applied to the word lines 42, 44 at the time of the write operation is higher than at the time of the read operation.

Specifically, the decoders 52, 62 respectively output the voltage $V_{dd}$. The step-up circuit 54 outputs the voltage ($V_{dd}+\alpha$) by stepping up the voltage $V_{dd}$ outputted by the decoder 52 by $\alpha$ at the time of the write operation. Similarly, the step-up circuit 64 outputs the voltage ($V_{dd}+\alpha$) by stepping up the voltage $V_{dd}$ outputted by the decoder 62 by $\alpha$ at the time of the write operation. Here, $V_{dd}$ may be set to, for example, 1.0 V, and $\alpha$ may be set to, for example, 0.2 V.

Figure 4:
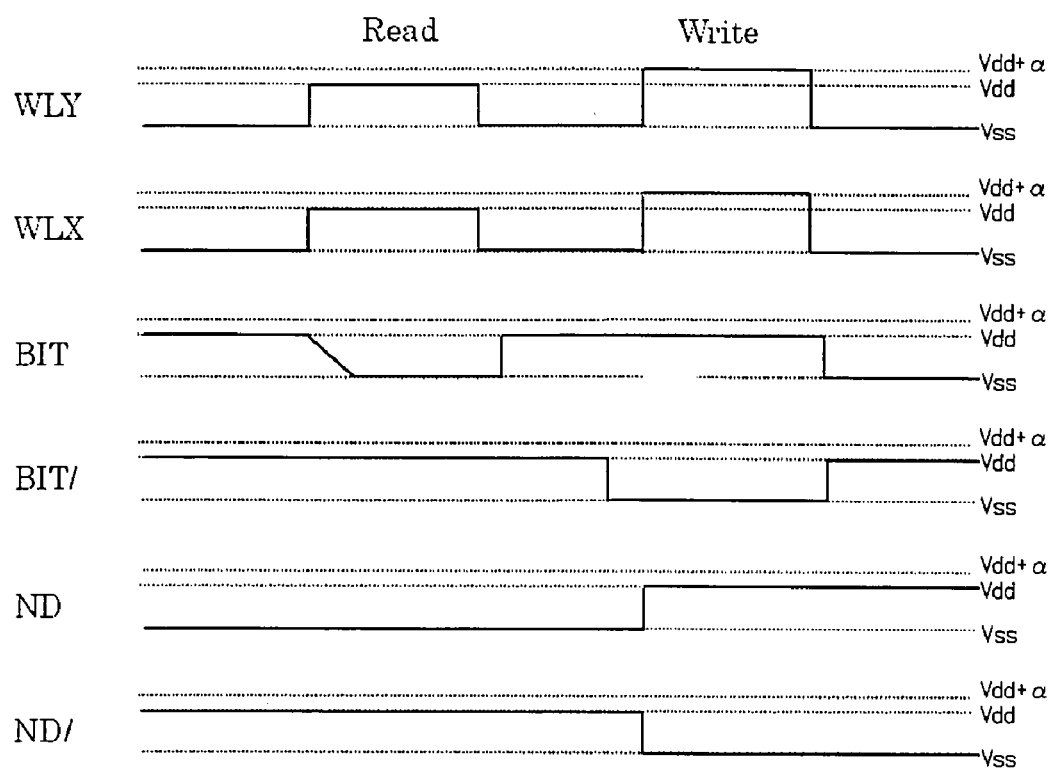
FIG. 4 is a timing chart illustrating the operation of the SRAM cell of FIG. 3.

A description of the operation of the SRAM cell 2 will now be given with reference to FIG. 4. In the drawing, WLY, WLX, BIT and BIT/indicate the potential of the word line 44, the word line 42, the bit line 46 and the bit line 48, respectively. Further, ND and ND/indicate the potential of the output terminal 10a and the output terminal 20a, respectively.

First, a description is given of the read operation. In this example, as shown in the drawing, the potential of the output terminal 10a is taken to be low ($V_{ss}$), and the potential of the output terminal 20a is taken to be high ($V_{cc}$). Further, the bit lines 46, 48 are taken to be in a pre-charged high state. In this state, the FETs 32, 34, 36, 38 are put on by putting the potentials of the word lines 42, 44 high using the voltage applying circuits 50, 60. In doing so, the bit line 46 is discharged. As a result, it is possible to read out data stored in the latch circuit.

Next, a description is given of the write operation. In this example, it is taken that data is written in such a manner that the potential of the output terminal 10a becomes high and the potential of the output terminal 20a becomes low. First, one (bit line 46) of the pre-charged bit lines 46, 48 is held high, and the other (bit line 48) is put low. In this state, the potentials of the word lines 42, 44 are put high using the voltage applying circuits 50, 60. At this time, a voltage ($V_{dd}+\alpha$) that is higher than $V_{dd}$ by $\alpha$ is applied to the word lines 42, 44. As a result, the FETs 32, 34, 36, 38 are put on, and the output terminal 10a and the output terminal 20a are put to high and low, respectively. Data can therefore be written to the latch circuit.

Continuing on, a description is now given of the effects of this embodiment. For the SRAM cell 2 also, it is possible to keep the number of parameters to be managed at the time of manufacture small because design is such that gate widths are equal between the FETs 32, 34, 36, 38 and the FETs 12, 22. As a result, a semiconductor storage device that is easy to manufacture can be realized.

Further, the voltage applying circuits 50, 60 applying a larger voltage to the word lines 42, 44 at the time of the write operation than at the time of the read operation are provided in the SRAM cell 2. As a result, it is possible to apply a high voltage to the gates of the FETs 32, 34, 36, 38 and increase the power of the FETs 32, 34, 36, 38 at the time of writing. This contributes to raising of the write margin of the SRAM cell 2.

The voltage applying circuit 50 is composed of the decoder 52 outputting the voltage $V_{dd}$, and the step-up circuit 54 outputting the voltage ($V_{dd}+\alpha$) at the time of the write operation by stepping up the voltage $V_{dd}$ outputted by the decoder 52. It is therefore possible for the voltage applying circuit 50 to be implemented with a simple configuration. Similarly, the voltage applying circuit 60 is also composed of the decoder 62 and the step-up circuit 64 and may also be implemented using a straightforward configuration.

The semiconductor storage device of the present invention is by no means limited to the aforementioned embodiments and various modifications are possible. In the aforementioned embodiments, the gate widths and gate lengths of the pass transistors are designed to be the same as the gate widths and gate lengths of the drive transistors, respectively, but design where only one of the gate widths or the gate lengths are equal is also possible. Further, the gate widths of the load transistors may also be different from the gate widths of the pass transistors or the drive transistors. Similarly, the gate lengths of the load transistors may also be different from the gate lengths of the pass transistors or the drive transistors.

It is apparent that the present invention is not limited to the above embodiments and may be modified and changed without departing from the scope and spirit of the invention.

What is claimed is:

1. A semiconductor storage device comprising an SRAM cell, said SRAM cell comprising:
   an N-type conduction type first drive transistor constituting a first inverter;
   an N-type conduction type second drive transistor constituting a second inverter with an input terminal and an output terminal connected to an output terminal and an input terminal of said first inverter, respectively;
   a first pass transistor provided in a path between said output terminal of said first inverter and a first bit line;
   a second pass transistor provided in a path between said output terminal of said second inverter and a second bit line;
   a third pass transistor provided in a path between said first pass transistor and said first bit line; and
   a fourth pass transistor provided in a path between said second pass transistor and said second bit line,
   wherein said each drive transistor and said each pass transistor have mutually equal gate widths or gate lengths.

2. The semiconductor storage device according to claim 1, wherein said each drive transistor and said each pass transistor have both mutually equal gate widths and gate lengths.

3. The semiconductor storage device according to claim 1, said SRAM cell comprising a P-type conduction type first load transistor constituting said first inverter, and a P-type conduction type second load transistor constituting said second inverter,
   wherein said each drive transistor, said each pass transistor, and said each load transistor have mutually equal gate widths or gate lengths.

4. The semiconductor storage device according to claim 3, wherein said each drive transistor, said each pass transistor, and said each load transistor have both mutually equal gate widths and gate lengths.

5. The semiconductor storage device according to claim 1, wherein a diffusion layer provided with a source-drain region of each said transistor extends along a straight line.

6. The semiconductor storage device according to claim 1, wherein a polysilicon layer constituting a gate electrode of said each transistor extends along a straight line.

* * * * *